United States Patent
Petzold et al.

(10) Patent No.: US 7,042,310 B1
(45) Date of Patent: May 9, 2006

(54) HIGH-PASS BRANCH OF A FREQUENCY SEPARATING FILTER FOR ADSL SYSTEMS

(75) Inventors: Joerg Petzold, Bruchkobel (DE); Johannes Beichler, Rodgau (DE); Dirk Heumann, Nidderau (DE)

(73) Assignee: Vacuumschmelze GmbH, (DE)

( * ) Notice: Subject to any disclaimer, the term of this patent is extended or adjusted under 35 U.S.C. 154(b) by 407 days.

(21) Appl. No.: 10/009,415

(22) PCT Filed: Jun. 8, 2000

(86) PCT No.: PCT/DE00/01875

§ 371 (c)(1),
(2), (4) Date: Mar. 25, 2002

(87) PCT Pub. No.: WO00/77928

PCT Pub. Date: Dec. 21, 2000

(30) Foreign Application Priority Data

Jun. 11, 1999 (DE) ................. 199 26 699

(51) Int. Cl.
*H04B 1/58* (2006.01)
(52) U.S. Cl. .................. 333/118; 333/123; 333/132
(58) Field of Classification Search ................ 333/118, 333/126, 132
See application file for complete search history.

(56) References Cited

U.S. PATENT DOCUMENTS

| | | | |
|---|---|---|---|
| 1,601,400 A * | 9/1926 | Latour ........................ | 332/173 |
| 3,683,271 A * | 8/1972 | Kobayashi ................... | 323/355 |
| 4,262,233 A * | 4/1981 | Becker et al. .............. | 315/248 |
| 4,385,932 A * | 5/1983 | Inomata et al. ............. | 148/304 |
| 4,587,507 A * | 5/1986 | Takayama et al. .......... | 336/178 |
| 5,074,932 A | 12/1991 | Binkofski et al. | |
| 5,157,272 A * | 10/1992 | Seddon ........................ | 307/106 |
| 5,567,537 A | 10/1996 | Yoshizawa et al. | |
| 5,627,501 A | 5/1997 | Biran et al. | |
| 5,966,064 A * | 10/1999 | Yoshizawa et al. ......... | 336/221 |
| 6,177,849 B1 * | 1/2001 | Barsellotti et al. .......... | 333/177 |
| 6,531,945 B1 * | 3/2003 | Ahn et al. ................... | 336/200 |
| 6,559,808 B1 * | 5/2003 | Petzold et al. .............. | 343/787 |
| 6,717,504 B1 * | 4/2004 | Fujiwara et al. ............ | 336/233 |
| 6,737,951 B1 * | 5/2004 | Decristofaro et al. ....... | 336/234 |
| 6,873,239 B1 * | 3/2005 | Decristofaro et al. ....... | 336/178 |

FOREIGN PATENT DOCUMENTS

| | | |
|---|---|---|
| DE | 19548530 | 6/1997 |
| EP | 0 637 038 A | 2/1995 |
| EP | 0 677 938 A | 10/1995 |
| WO | WO 97/11534 | 3/1997 |
| WO | WO 97/48206 | 12/1997 |
| WO | WO 98/12847 | 3/1998 |

* cited by examiner (Continued)

OTHER PUBLICATIONS

WO99/45643 Petzold et al "Low Pass Filter for a Diplexer" Published Sep. 10, 1999.*

*Primary Examiner*—Robert Pascal
*Assistant Examiner*—Kimberly Glenn
(74) *Attorney, Agent, or Firm*—Dean W. Russell; Kristen M. Crall; Kilpatrick Stockton LLP

(57) ABSTRACT

The invention relates to a high-pass branch (7) of a frequency separating filter for ADSL systems comprising inductive components (11, 14) which dispose of magnet cores made of a soft magnetic amorphous or nanocrystalline. As a result, frequency separating filters are provided which comprise small structural shapes and which have especially beneficial properties in the relevant frequency and temperature range.

13 Claims, 8 Drawing Sheets

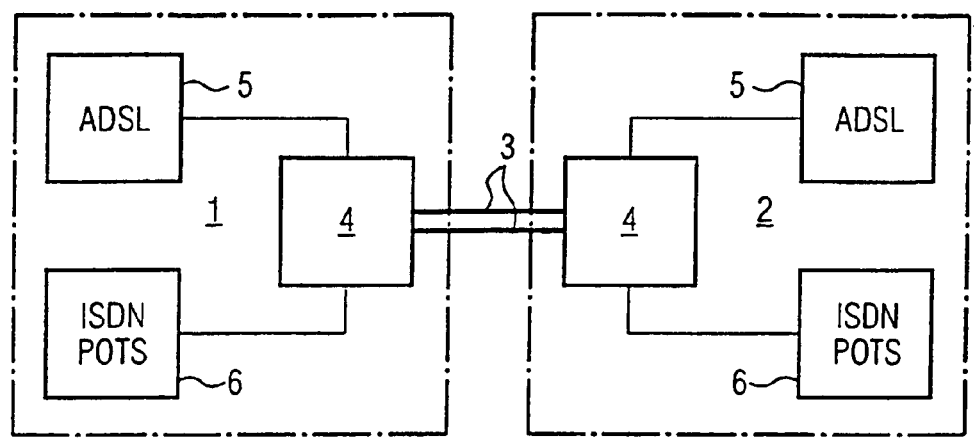
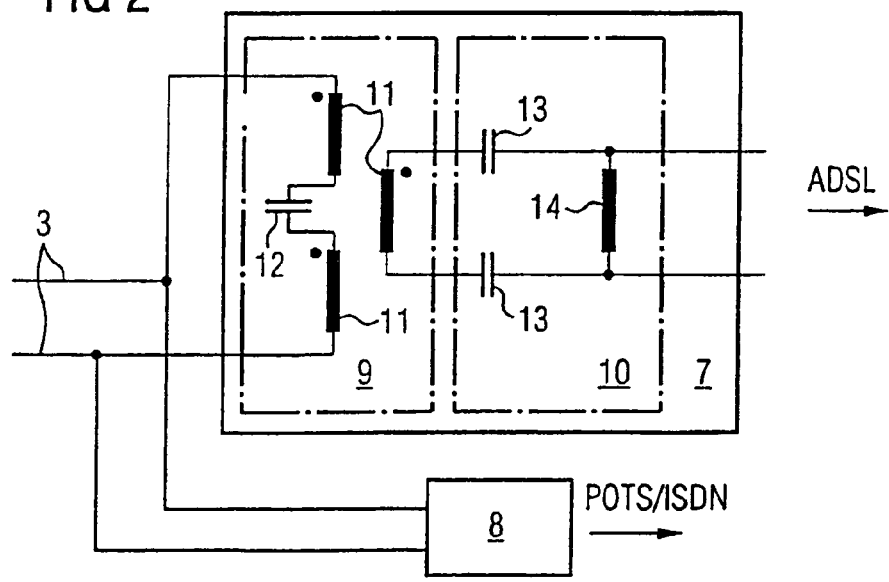

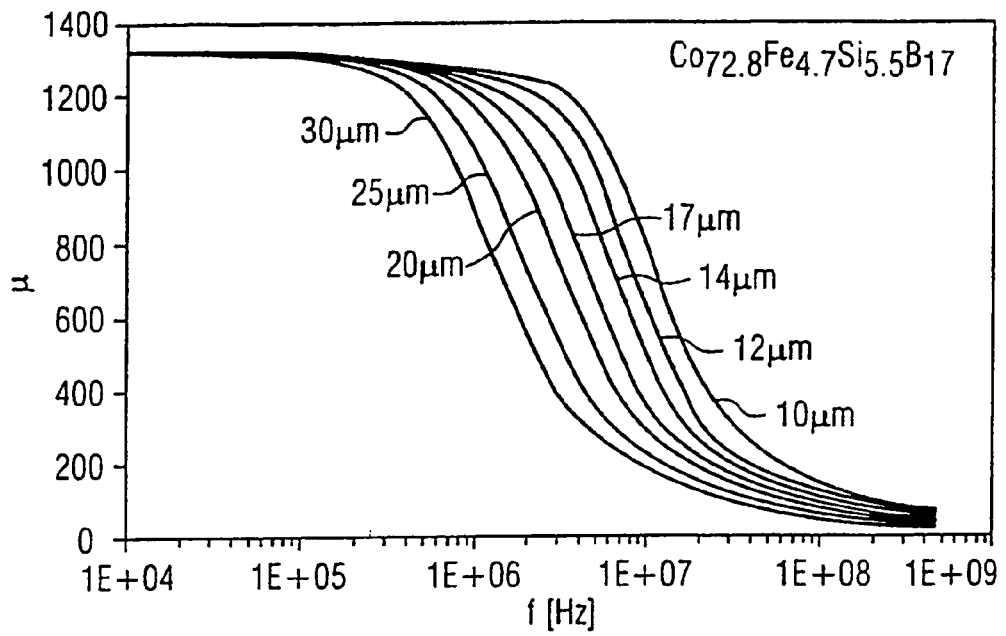
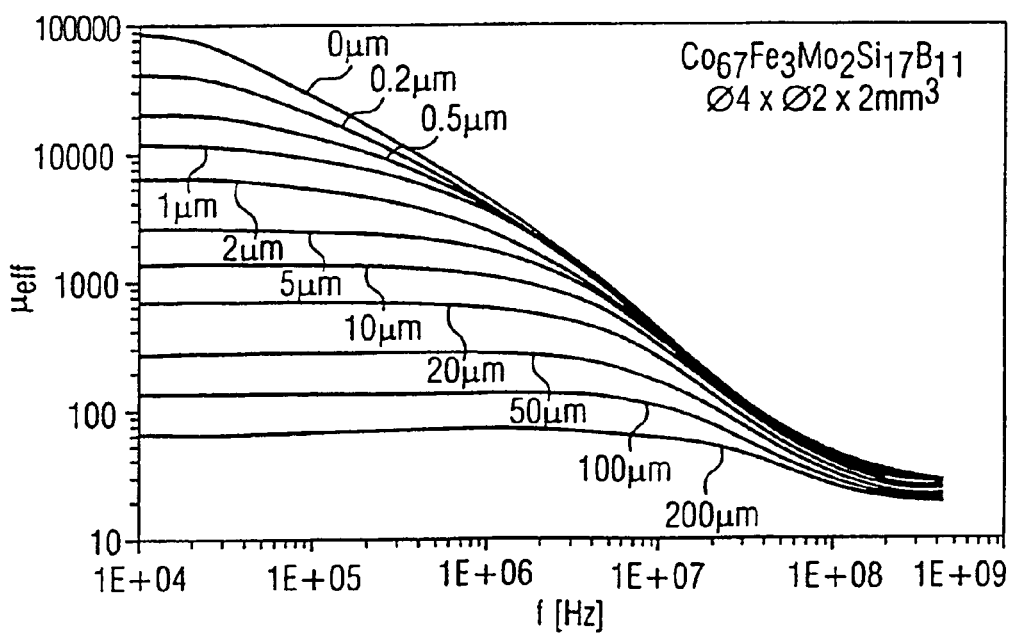

HIGH-PASS BRANCH OF A FREQUENCY SEPARATING FILTER FOR ADSL SYSTEMS

This application claims priority to German Application No. 199 26 699.9 filed on Jun. 11, 1999 and International Application No. PCT/DE00/01875 filed on Jun. 8, 2000.

The invention relates to a frequency separating filter having a low-pass branch for low frequency signals, particularly of analog communications systems, and having a high-pass branch for high frequency signals of digital communications systems, with multiple inductive components having magnetic cores.

Until now, RM4, RM6, RM8 and other ferrite pot cores made of core materials such as N27 and N48 were used as magnetic cores. The necessary distortion factor requirement was achieved in this case by means of gapping through slots in the magnetic core.

A disadvantage of gapping is that it causes a reduction of the effective available core permeability to values around 200. To achieve the necessary useful inductance, low insertion loss in the blocking zone, and the necessary modulation capability, the volume of the high-pass branch having ferrite cores must be designed very large, depending on the construction, so that high-pass branches produced from ferrite cores occupy considerable space. Furthermore, high coupling and winding capacitances and leaked inductance result from the high number of turns per unit length of the primary and secondary taping of the ferrite solutions due to the low permeability, which could lead to interference effects.

Proceeding from this related art, the invention has the object of providing a frequency separating filter whose high-pass branch is suitable for high frequency signals of digital communications systems and has a low structural volume.

This object is achieved in that the high-pass branch comprises at least one component having a magnetic core made of an amorphous or nanocrystalline alloy.

Soft-magnetic alloys which are amorphous and nanocrystalline have a significantly higher permeability than ferrite. It is nonetheless difficult to produce magnetic cores from a soft-magnetic alloy which is amorphous or nanocrystalline in such a way that the hysteresis loops have the necessary linearity for use in digital broadband communications systems. A high degree of linearity is, however, necessary to fulfill the requirements placed on the distortion factor. Since, however, the magnetic modulation of the magnetic core falls with increasing frequencies, deviations from an ideally linear hysteresis loop, which occur during large modulations, are harmless for high frequencies. Therefore, it is possible to provide amorphous or nanocrystalline soft-magnetic alloys for the inductive components in the high-pass branch of the separating filter.

Preferred alloys for use in the high-pass branch of the frequency-separating filter are the object of the dependent claims.

In the following, the invention is described in detail with reference to the attached drawing.

FIG. 1 shows an overview of the connection between a local exchange and a user-side network connection;

FIG. 2 shows a frequency-separating filter having a high-pass branch and a low-pass branch;

FIG. 3 shows a diagram which illustrates an example of the dependence of the frequency response of the permeability on the thickness of the tapes used for the production of a magnetic core;

FIG. 4 shows a further diagram which illustrates the dependence of the frequency response of the permeability on the width of a slot introduced into a magnetic core;

Figure 5:
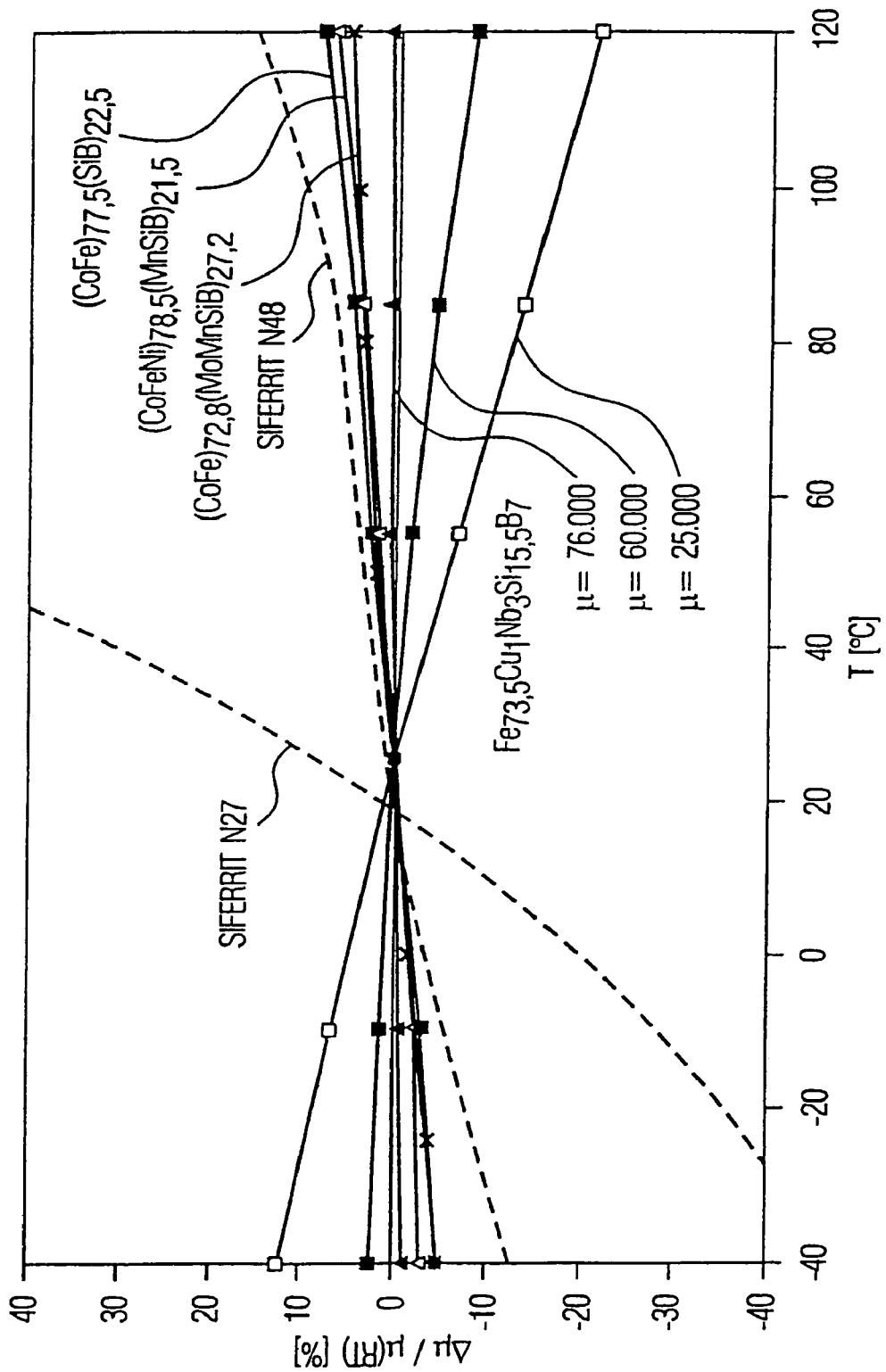
FIG. 5 shows an illustration of the changes in permeability depending on the temperature in relation to the permeability at room temperature.

Since not all of the details of VDSL systems have been established yet, inductive components of ADSL systems in particular are described in the following. According to the current information, it can be assumed that the requirements for inductive components of VDSL systems largely correspond to those of ADSL systems.

As shown in FIG. 1, the connection between an ADSL-capable digital local exchange 1 and a user-side network connection 2 (ADSL modem) occurs via a public two-wire line in the ADSL (Asymmetric Digital Subscriber Line) telecommunication system. POTS (Plain Old Telephone System) or ISDN (Integrated Services Digital Network) connections can run simultaneously with the ADSL data over the same two-wire line. The separation and transmission of the low frequency components (POTS, ISDN) and the high frequency components (ADSL) is effected by frequency separating filters 4 which sit at the end of public two-wire line 3.

The high frequency ADSL signals running over the public two-wire line 3 are steered by the frequency separating filters 4 into an ADSL branch 5, while the low frequency POTS and ISDN signals are steered by the frequency separating filters 4 into the POTS/ISDN branches 6, respectively. The frequency separating filters 4 thus comprise a high-pass branch 7 and a low-pass branch 8. In the exemplary embodiment shown in FIG. 2, the high-pass branch 7 is formed by a high-pass transformer 9 and high-pass filter components 10 connected downstream to it. The high-pass transformer 9 has three coils 11, wound on a joint magnetic core, and a capacitor 12 connected between the primary-side coils 11. The downstream high-pass filter components 10 comprise capacitors 13 and a high-pass filter choke 14. The inductors of the high-pass transformer 9 and the high-pass filter choke 14 are referred to in brief in the following as the inductive components of the high-pass branch 7.

It should be noted that, in addition to the exemplary embodiment illustrated in FIG. 2, further embodiments of high-pass branch 7 are conceivable.

Thus, the inductive components shown here can also be used in other embodiments of the high-pass branch 7, for example in an elliptical or inverse-Chebyshev high-pass branch 7.

Depending on the transmission system, one differentiates between the DMT system (discrete multitone) and the CAP system (carrierless amplitude phase modulation). The codes have effects on the spectral distribution of the magnetization current of the high-pass branch 7 in the frequency-separating filter 4.

Furthermore, one must differentiate ADSL systems via POTS and ISDN, which have different lower limiting frequencies (POTS: approximately 30 kHz, ISDN: approximately 140 kHz). Therefore, in the following differentiation is made between ADSL-POTS splitters and ADSL-ISDN splitters. Due to the lower limiting frequencies and higher voltage amplitudes in POTS, one obtains a stronger modulation of the inductive components of the high-pass branch 7 with POTS than with ISDN. However, magnetic cores of the inductive components of the high-pass branch 7 may neither be saturated due to the $U_{ac}$ modulation, nor may they be modulated to such degree that system-specific properties which are defined in the applicable norms are no longer fulfilled.

Therefore, the following requirements are placed on the inductive components inserted on both sides of the public two-wire line 3 in the high-pass branch 7:

a) minimum structural volume b) suitability for the transmission code systems

DMT

CAP

QAM/MQAM ((multiple) quadrature amplitude modulation)

c) main inductors <2 mH depending on the filter layout, generally <0.5 mH, preferably <0.1 mH d) AC voltage modulation of inductors at high frequencies by ADSL signals (from 20 kHz, up to 45 Vpp)

at lower frequencies by POTS and ISDN signals with typical levels in accordance with 1TR110 and ETR80 e) loops in accordance with ANSI T1E1.413 and ETSI ETR 328 f) low core weight and SMD capability g) ring core shape, therefore simpler safety requirements in accordance with IEC 950 h) low insertion loss in the ADSL pass range (currently >30 kHz (POTS) or >140 kHz (ISDN) at 1.1 MHz, possibly up to 1.8 MHz), high insertion loss in the ADSL stop range (currently <20 kHz (POTS) or <100 kHz (ISDN))

i) low and monotonic temperature response of the relevant magnetic characteristics in the range −40° C.–100° C.

The present invention concerns inductive components for the high-pass branch 7 in ADSL-POTS splitters and ADSL-ISDN splitters, which include a small metal tape core made of an amorphous or nanocrystalline alloy instead of a ferrite core. This core obtains its properties, which conform to standards, through an optimized combination of thickness, alloy, and heat treatment in a magnetic field as well as core-technology manufacturing steps.

A first basic requirement is that the permeability of the core materials of the inductive components in the high-pass branch 7 remains as constant as possible over the entire ADSL frequency range. As FIGS. 3 and 4 show, this requirement was fulfilled as follows:

Magnetic cores, which are produced from low-permeability ($\mu$<2,500) alloys, are preferably unslotted. The necessary frequency properties are set in this case via the specific electrical resistance $\rho$ of the alloy and the tape thickness $d_{Band}$. As shown in FIG. 3, $d_{Band}$ is to be <30 μm, preferably <20 μm, and as much as possible <17 μm or even lower, so that the permeability of the core materials remains as constant as possible in the relevant frequency range. As shown in FIG. 5, these μ(f) properties of the heat-treated materials used here remain stable over a wide temperature range.

In contrast, if the magnetic cores are produced from higher permeability alloys ($\mu \geq 2{,}500$, preferably $\mu \geq 10{,}000$), the frequency response of the permeability μ and therefore that of the inductance L can be significantly improved by introducing a slot of a tailored width, as shown in FIG. 4. The slot width $d_{Schlitz}$ depends in turn on the combination of alloy/heat treatment. Typical widths are in the range from 1 to 200 μm.

A second basic requirement is that the insertion loss in the high-pass branch 7 is as low as possible over the entire ADSL frequency range, in accordance with ANSI T1E1.413. For the overall system, comprising two ADSL modems, $a_E$ must be <1 dB in the 100 ohm or 135 ohm system, without taking the line into consideration, with $a_E$ being the insertion loss. In this case, the insertion loss decreases with increasing value of $R_p$ for a predetermined wave impedance. In this case, $R_p$ is the ohmic resistance in the parallel equivalent network diagram for the inductive components, which represents the hysteresis losses in the magnetic core and the ohmic copper losses of the taping. In this case, the relationship $$R_p(f)=2*\pi^2*N^2*(1/\rho_{mech})*(A_{Fe}/l_{Fe})*f^2*B^2/P_{Fe}(f) \qquad (1)$$

applies, with N being the number of turns, $\rho_{mech}$ being the specific density of the magnetic core, $A_{Fe}$ being the cross-sectional surface of the magnetic core, $l_{Fe}$ being the iron path length, B being the magnetic induction, and $P_{Fe}(f)$ being the frequency response of the specific overall losses, which in turn depends on the hysteresis and tape properties.

The insertion loss $a_E$ depends, in the way described above, solely on the loss resistance $R_p$, above all in the range of lower and middle frequencies. The low hysteresis losses and the low values of the winding resistance $R_{ou}$, due to the small number of turns necessary, therefore lead to a low insertion loss $a_E$ in the lower and middle frequency range. At high frequencies, the fact must also be considered that metallic ring tape cores allow particularly low scattering inductances, so that a transformer having such a ring tape core is also distinguished in this case by particularly low insertion loss values and high reflection loss values $a_R$. The low winding capacitances, which can be implemented due to the small number of turns necessary, also lead to favorable $a_E$ and $a_R$ values in the range of higher frequencies. As a result, metallic ring tape cores therefore have particularly good properties in this regard in the entire frequency range.

Figure 6:
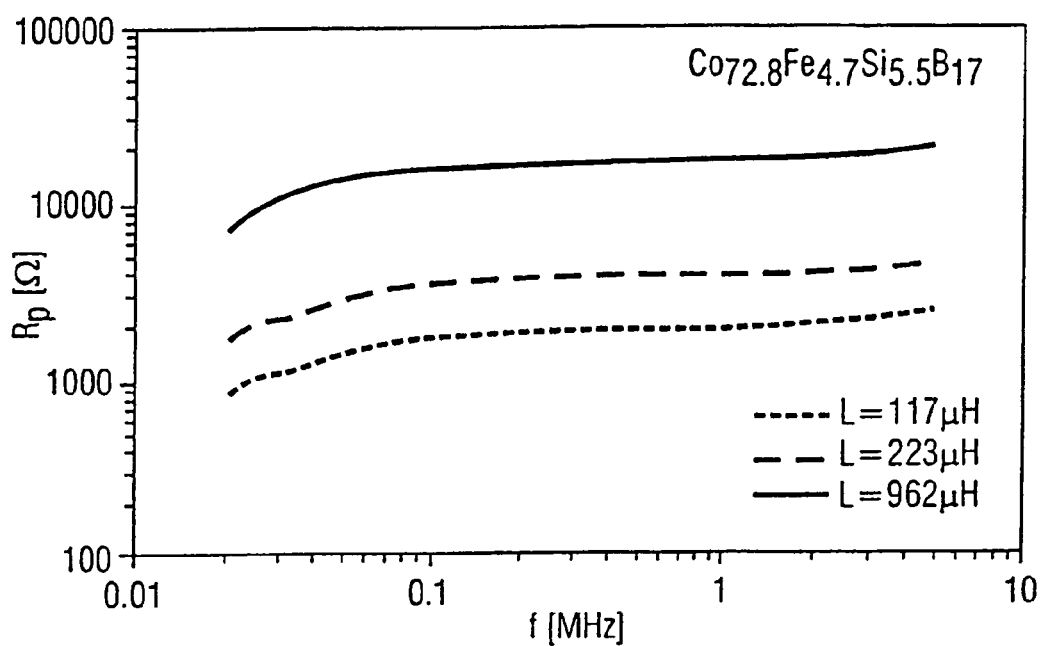
FIG. 6 shows an illustration of the frequency response of the loss resistance Rp in the parallel equivalent network diagram of coils which have magnetic cores made of an amorphous alloy.
Figure 7:
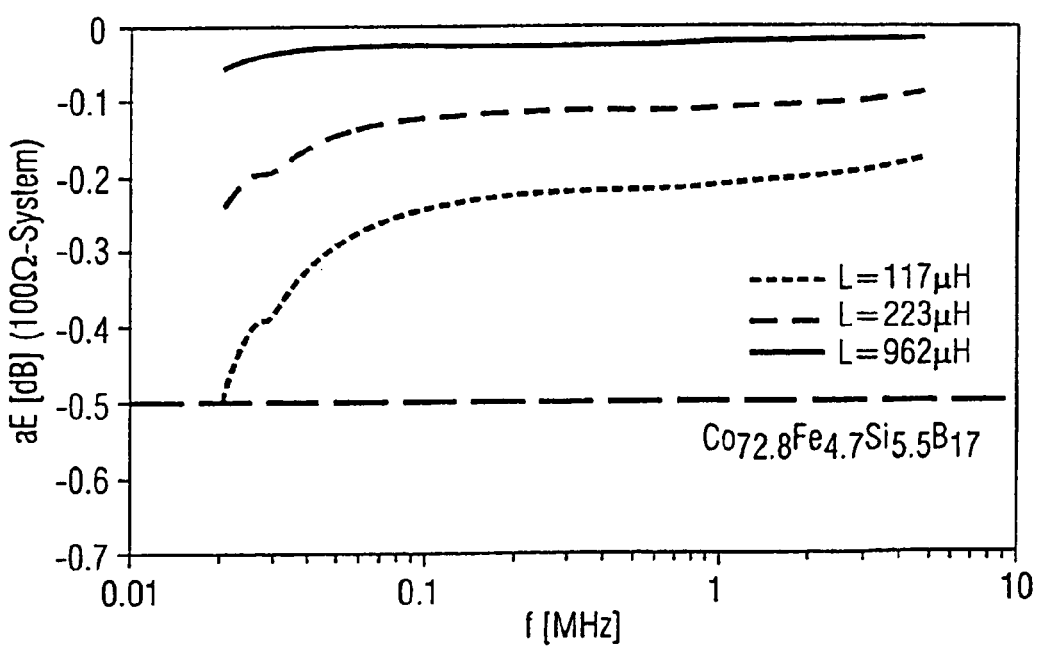
FIG. 7 shows an illustration of the frequency response of the insertion loss of the coils from FIG. 6.

As can be seen from FIGS. 6 and 7, particularly large $R_p$ values can be achieved with the heat-treated magnetic alloys used here, even with very small iron path lengths, i.e., small core geometries. Furthermore, it was discovered that a reduction of the tape thickness from 30 μm to 20 μm, preferably to 17 μm or even less, led to a further increase of $R_p$, without the dimensions of the core being enlarged due to this.

In summary, it can be established that, precisely through the combination of extremely linear hysteresis loops and thin tapes of the heat-treated alloys used here, which have a high specific electrical resistance, ADSL high-pass branches 7 with particularly small insertion losses can be produced.

The $R_p$ value can be improved even more by coating at least one tape surface with an electrically insulating medium, which must have a low relative permittivity of $\epsilon_r$<10. Another possibility for displacing the permeability reduction affected by loss is achieved by the defined setting of the permeability to the lowest possible level within specific boundaries or by introducing a tailored slot. The properties of inductive components for the high-pass branch 7 which conform to standards can be achieved best with amorphous alloys based on cobalt, which are almost free of magnetostriction, and with fine crystalline alloys which are practically free of magnetostriction. The latter are typically referred to as "nanocrystalline alloys" and are characterized by an extremely fine grain with an average diameter of less than 100 nm, which occupies more than 50% of the material volume. An important requirement is that the inductors have a high saturation induction of $B_{[s]}>0.6$ T, preferably >0.9 T, more preferably >1 T, and a very linear hysteresis loop with a saturation to remanence ratio of $B_r/B_s<0.2$, preferably <0.05. In this connection, the nanocrystalline materials based on iron which are free of magnetostriction are distinguished by a particularly high saturation induction of 1.1 T or more. A list of all of the alloy systems considered and found suitable according to the invention is found below.

Figure 8:
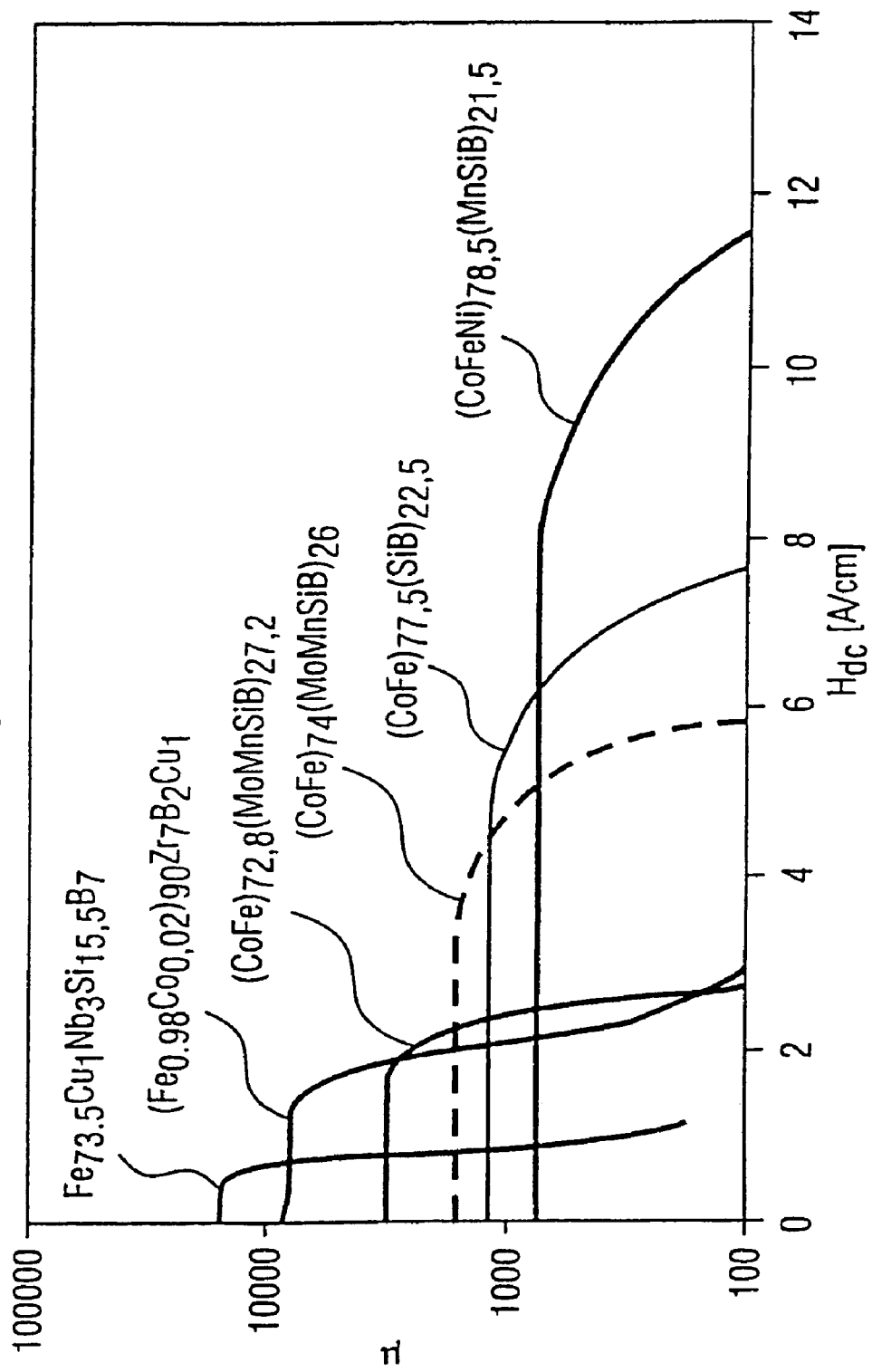
FIG. 8 shows an illustration of the static field initial load capacity of magnetic cores made of various amorphous and nanocrystalline alloys.
Figure 9:
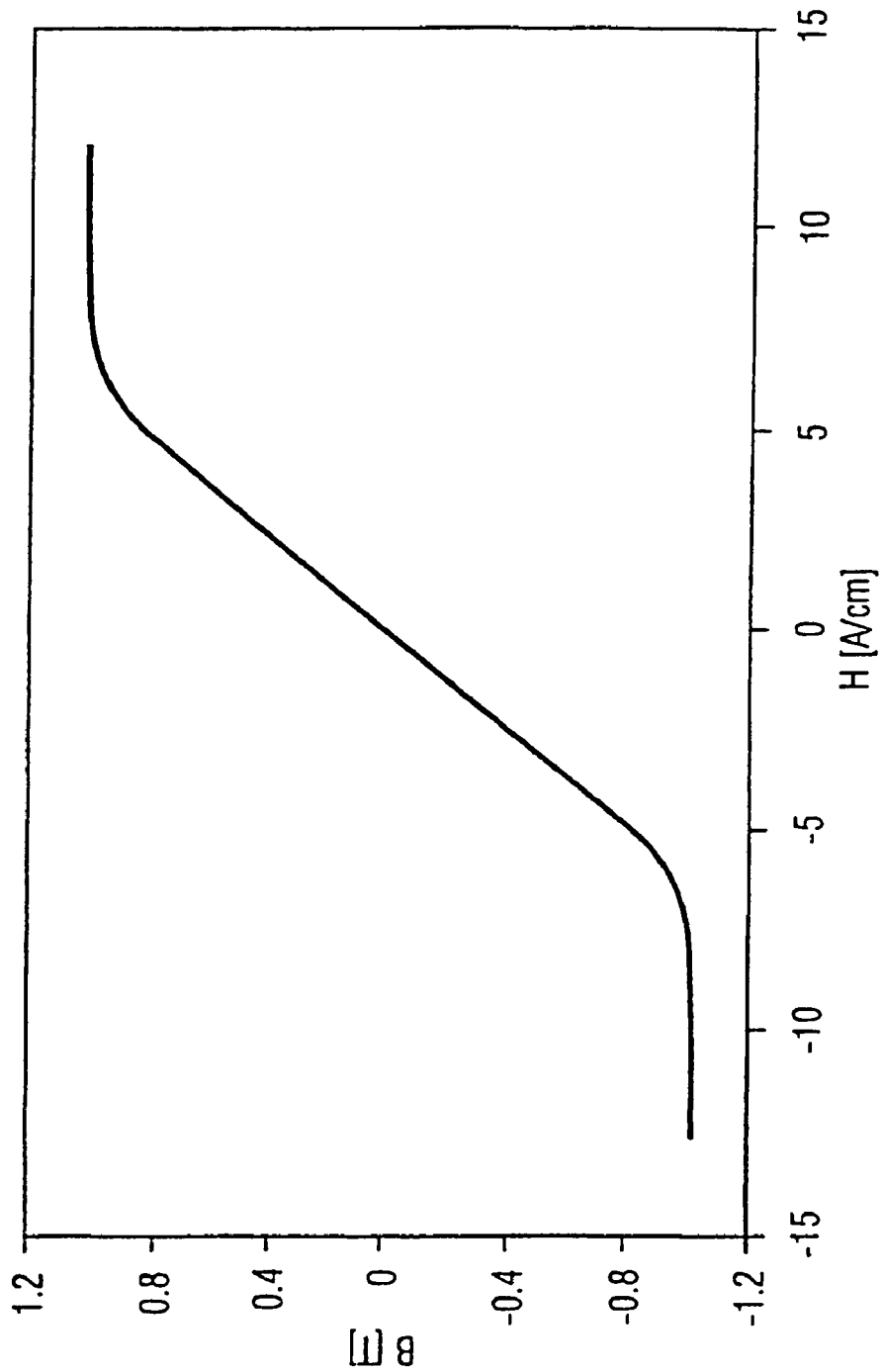
FIG. 9 shows a hysteresis loop having nearly ideal linearity.

The third basic requirement for achieving the properties required in the high-pass branch of ADSL-POTS or ADSL-ISDN splitters is a pronounced linearity behavior of the hysteresis loops, as is shown, for example, in FIGS. 8 and 9. Such linear hysteresis loops can be achieved, for example, by the manufacturing procedures described in the following:

The soft-magnetic amorphous tape, produced by means of rapid solidification technology, with a thickness d<30 μm, preferably <20 μm, more preferably <17 μm, made of one of the alloys listed below, is wound tension-free on special machines into the magnetic core in its final dimension. Alternatively, magnetic cores could also be considered in this case which are constructed from a stack of stamped disks made of the alloys mentioned.

As already mentioned, the requirements conforming to the standards for the frequency properties can be fulfilled even better if the tape is coated on one or two sides with an electrically insulating material before the winding of the magnetic core, particularly before the stamping of the disks.

For this purpose, depending on the requirements for the quality of the insulating film, an immersion, pass-through, spray, or electrolysis method is used on the tape. The same effect can, however, also be achieved by immersion insulation of the wound or stacked magnetic core. In the selection of the insulating medium, care should be taken that, on one hand, it adheres well to the tape surface, and, on the other hand, it does not cause any surface reactions which could lead to damage of the magnetic properties. For the alloys used in this case according to the invention, oxides, acrylates, phosphates, silicates, and chromates of the elements Ca, Mg, Al, Ti, Zr, Hf, and Si have been shown to be effective and compatible insulators. In this case, Mg was particularly effective, which is applied as a liquid preproduct containing magnesium to the tape surface, and which transforms into a dense film of MgO, whose thickness can be between 50 nm and 1 μm, during a special heat treatment which does not influence the alloy.

During the subsequent heat treatment of the insulated or uninsulated magnetic core to set the soft-magnetic properties, it is to be differentiated whether the magnetic core is made of an alloy which is suitable for achieving a nanocrystalline structure or not.

Magnetic cores made of alloys which are suitable for nanocrystallization are subjected to an exactly tailored crystallization heat treatment, which lies between 440° C. and 690° C. depending on the alloy composition, to achieve the nanocrystalline structure. Typical dwell times are between 4 minutes and 8 hours. Depending on the alloy, this crystallization heat treatment is to be performed in vacuum or in a passive or reducing protective gas. In all cases, material-specific purity conditions are to be considered, which are to be produced by appropriate aids such as element-specific absorber or getter materials, depending on the case. At the same time, through an exactly balanced combination of temperature and time, the fact is exploited that with the alloy compositions used here, the magnetostriction contributions of fine crystalline grain and amorphous residual phase precisely offset one another and the necessary freedom from magnetostriction $|\lambda_s|<2$ ppm, preferably even $|\lambda_s|<0.2$ ppm, arises. Depending on the alloy and embodiment of the component, annealing is either performed without a field or in a magnetic field lengthwise to the direction of the wound tape ("longitudinal field") or transverse to this ("transverse field"). In specific cases, a combination of two or even three of these magnetic field configurations may also be necessary in sequence or parallel to one another. Particularly flat and linear loops were achieved if the magnetic cores were stacked up on their faces exactly so that the stack height was 10 times, preferably at least 20 times, the core outer diameter and if a strong transverse field was already applied during the crystallization heat treatment described. As a rule, the hysteresis loops were flatter in this case the higher the transverse field temperature applied, with exceeding the alloy-specific Curie temperatures and the occurrence of non-magnetic phases, such as Fe borides, establishing an upper limiting temperature.

The magnetic properties, i.e., the linearity and the slope of the hysteresis loops may—if necessary—be varied within a wide range by an additional heat treatment in a magnetic field which is parallel to the rotational symmetry axis of the magnetic core—i.e., perpendicular to the tape direction. Depending on the alloy and permeability level to be set, temperatures between 350° C. and 690° C. are necessary in this case. Due to the kinetics of the atomic reorientation procedures, the resulting permeability values are normally lower the higher the transverse field temperature. Typical characteristic curves of various suitable nanocrystalline magnetic alloys, which express their linearity behavior, can be seen in FIG. 8. This magnetic field heat treatment was either combined directly with the crystallization heat treatment or performed separately. The same conditions applied for the annealing atmosphere as in the crystallization heat treatment for achieving the nanocrystalline structure.

Figure 10:
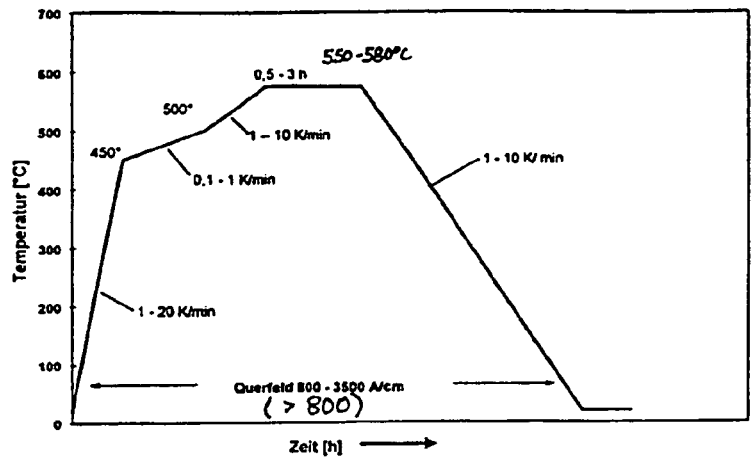
FIGS. 10–15 shows exemplary heat treatments.

It has been shown to be particularly good to subject nanocrystalline alloys whose permeabilities lie in the range between p=13,000 and p=20,000 to the following heat treatment. The cores are first heated from room temperature to a temperature which is approximately 450° C. or higher at a heating rate of 1 to 20 K/min and subsequently, after reaching the target temperature of 450° C. or somewhat higher, heated to a target temperature of 550° C. to 580° C. at a slower heating rate of 0.1 to 1 K/min and/or at a heating rate of 1 to 10 K/min and kept at this temperature for a period of 0.5 to 3 hours. The cores are then cooled to room temperature at a cooling rate of 1 to 10 K/min. The entire heat treatment typically occurs in a transverse field with a strength of 800 to 3,500 A/cm. This example of a heat treatment is shown in FIG. 10. It was successfully performed on magnetic cores made of a nanocrystalline alloy with the chemical composition $Fe_{73.5}Cu_1Nb_3Si_{15.5}B_7$, and in other cases. Since the magnetic cores were highly permeable, i.e., they had a permeability of approximately 15,000, they were subsequently magnetically gapped by slots.

Figure 11:
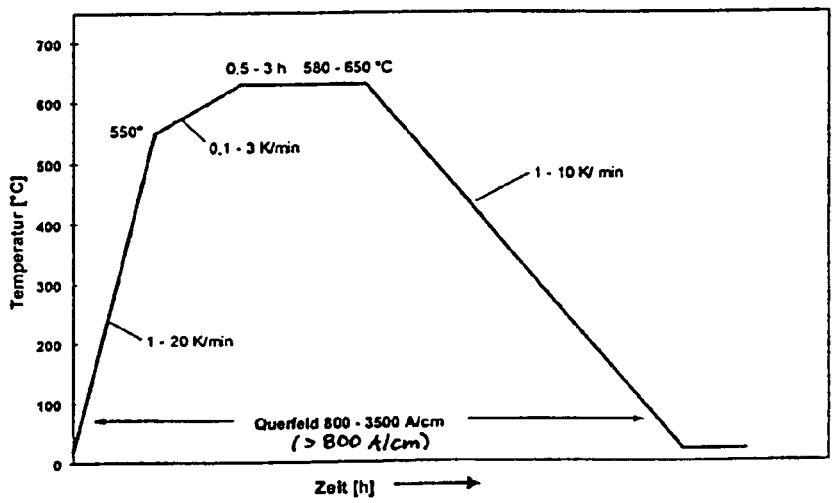

For nanocrystalline alloys which have a relatively low permeability compared to the nanocrystalline alloys above, i.e., they have permeabilities of less than 15,000, the following heat treatment has been shown to be particularly suitable. The magnetic cores are first heated from room temperature to a temperature of approximately 550° C. at a heating rate between 1 and 20 K/min and subsequently heated to a target temperature of 580° C. to 650° C. at a heating rate of 0.1 to 3 K/min. The magnetic cores are kept at this temperature for a period of 0.5 to 3 hours. The cores are subsequently cooled back to room temperature at a cooling rate of 1 to 10 K/min. The entire heat treatment is preferably performed in a transverse field with a strength of 800 to 3,500 A/cm. This example of a heat treatment is shown in FIG. 11. The magnetic cores obtained in this way are subsequently to be magnetically gapped by slots due to their relatively high permeability. This heat treatment was successfully performed on nanocrystalline alloys with the chemical composition $(Fe_{0.98}CO_{0.02})_{90}Zr_7B_2Cu_1$, on the alloy $Fe_{84}Zr_{3.5}Nb_{3.5}B_8Cu_1$, and on the alloy $Fe_{84}Nb_7B_9$, and in other cases. The first alloy mentioned had a permeability of approximately 8,000 in this case, the second alloy mentioned had a permeability of approximately 15,000, and the last alloy mentioned had a permeability of approximately 10,000 in this case.

In magnetic cores made of amorphous materials, the setting of the magnetic properties, i.e., of the curve and slope of the linear flat hysteresis loop, is performed by a heat treatment in a magnetic field which runs parallel to the rotational symmetry axis—i.e., perpendicular to the tape direction of the magnetic core. Through favorable control of the heat treatment, the fact is exploited that the value of the saturation magnetostriction changes during the heat treatment in the positive direction by an amount which depends on the alloy composition until it reaches the range $|\lambda_s|<2$ ppm, preferably even $|\lambda_s|<0.1$ ppm. As table 2 shows, this was also achieved when the amount of Xs was well over this value in the "as quenched" state of the tape. Depending on the alloy used, flushing of the core either with air or a reducing protective gas (e.g., $NH_3$, $H_2$, $CO_2$) or a passive protective gas (e.g., He, Ne, Ar, $N_2$, $CO_2$) is important in this case so that neither oxidation nor other reactions may occur on the tape surfaces. Solid-state physical reactions may also not occur inside the material due to protective gas which diffuses in.

The amorphous magnetic cores for the inductive components of the high-pass branch 7 of the ADSL-POTS or ADSL-ISDN splitters are typically, depending on the alloy composition used, heated under an applied magnetic field at a rate of 0.1 to 10 K/min to temperatures between 220° C. and 420° C., kept at these temperatures between 0.25 and 48 hours in the magnetic field, and subsequently cooled back to room temperature at 0.1–5 K/min. Due to the temperature dependence of the magnetic moments, the loops achieved in the amorphous alloys were flatter and more linear the lower the transverse field temperatures. The ever-slower kinetics during the reorientation leads at the same time to an alloy-specific lower limit, which is essentially determined by economic considerations, i.e., by 48-hour long annealing.

Due to the demagnetizing fields inside a core stack, which lead to a considerable weakening and divergence of the field lines, especially flat and linear loops were only achievable if the magnetic cores were stacked on their faces exactly so that the stack height was at least 10 times, preferably at least 20 times, the height of the core outer diameter. Typical characteristic curves which emphasize the linear character of the loops implemented in this case can be seen in FIG. 8.

In some cases, a temperature plateau in the transverse field may also be dispensed with and the magnetic preferential direction may be produced by cooling the magnetic cores in the transverse field. The permeability level is then set via the cooling rate below the Curie temperature of the magnetic material. This type of transverse field heat treatment after a preceding annealing treatment is particularly suitable for setting very high permeabilities. In magnetic cores treated in this way, the frequency properties conforming to the standards can be achieved through gapping by means of introducing a slot of a suitable width.

Figure 12:
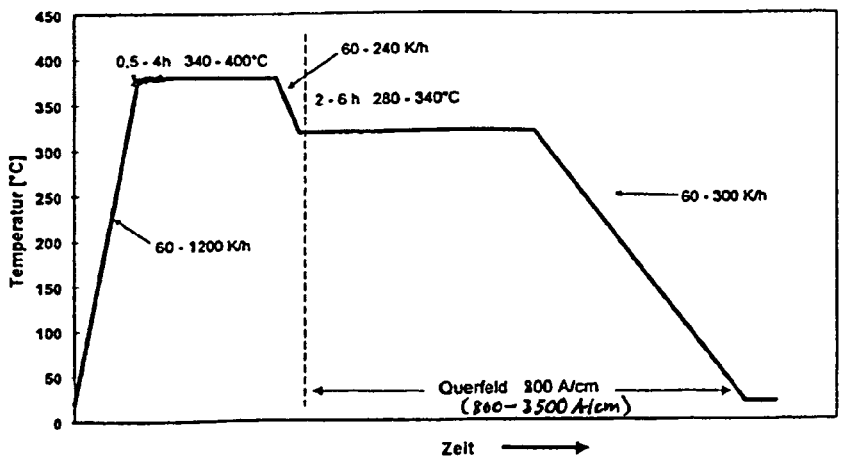

The following heat treatment has been shown to be particularly suitable in high permeability amorphous alloys, with high permeability referring in the following to permeability values which are significantly larger than 1,500. First, the amorphous alloy is heated from room temperature to a temperature between 340° C. and 400° C. at a heating rate between 60 and 1200 K/hour. In this case, the magnetic cores are left for a period of 0.5 to 4 hours at this temperature. Subsequently, the cores are cooled at a cooling rate between 60 K/hour and 240 K/hour to a temperature between 280° C. and 340° C. The magnetic cores are then left at this temperature for a period of 2 to 6 hours. After achieving this target temperature, the magnetic cores are typically subjected to a transverse field with a strength of approximately 1,200 A/cm. While maintaining this transverse field, the magnetic cores are subsequently cooled to room temperature at a cooling rate of 60 to 300 K/hours. The first temperature plateau, i.e., the temperature plateau in the range between 340° C. and 400° C., is used to dissipate mechanical stresses. The second temperature plateau, i.e., the temperature plateau in the range between 280° C. and 340° C., is used to achieve the uniaxial anisotropy Ku. Since the magnetic cores are "low permeability" in comparison to magnetic cores made of low-magnetostriction nanocrystalline alloys, they may subsequently remain ungapped. Such a heat treatment was, for example, successfully applied to the cobalt-based alloy $CO_{71.7}Fe_{1.1}Mo_1Mn_4Si_{13.2}B_9$. The example of a heat treatment just described is shown in FIG. 12.

Figure 13:
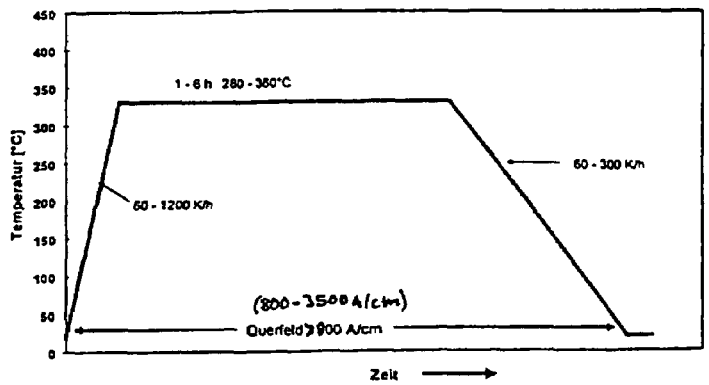

For magnetic cores made of amorphous alloys which are relatively low permeability in comparison to the alloy class just described, i.e., which have permeabilities which lie in the range of 1,500 or less, the following heat treatment has been shown to be particularly suitable. In this case, the magnetic cores are heated to a target temperature between approximately 280° C. and approximately 360° C. at a heating rate between 60 K/hour and 1200 K/hour. The magnetic cores are then kept at this target temperature for a period of 1 to 6 hours and subsequently cooled back to room temperature at a cooling rate between 60 K/hour and 300 K/hour. It should be noted that the entire heat treatment just described is typically performed in a transverse field with a strength of approximately 1,500 A/cm. This example of a heat treatment is shown in FIG. 13. The heat treatment just discussed was successfully performed on the amorphous cobalt-based alloys having the chemical compositions $CO_{72.5}Fe_{1.5}Mo_{0.2}Mn_4Si_{4.8}B_{17}$, on the alloy with the chemical composition $CO_{72.8}Fe_{4.7}Si_{5.5}B_{17}$, and on the alloy with the chemical composition $CO_{55.6}Fe_{6.1}Mn_{1.1}Si_{4.3}B_{16.2}Ni_{16.5}$. The magnetic cores made of the amorphous alloy first mentioned have a permeability of approximately 1,500 in this case, the magnetic cores made of the second alloy mentioned have a permeability of approximately 1,200 in this case and finally the magnetic cores made of the last alloy mentioned have a permeability of approximately 700 in this case. Since the magnetic cores are relatively "low permeability" they can remain unslotted.

Figure 14:
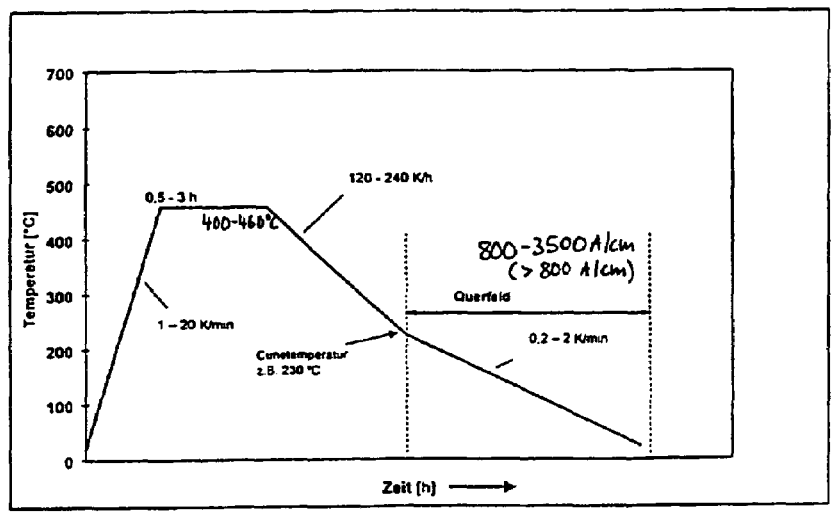

The following heat treatment has been shown to be particularly advantageous for extremely high permeability amorphous cobalt-based alloys, i.e., for alloys whose permeability is significantly over 20,000. First, they are heated from room temperature to a target temperature between approximately 400° C. and approximately 460° C. at a heating rate between 1 and 20 K/min. The magnetic cores are left for a period between approximately 0.5 hours and approximately 3 hours in this case. They are then cooled to a temperature which approximately corresponds to the Curie temperature $T_C$ at a cooling rate between approximately 120 K/hour and approximately 240 K/hour. After reaching the approximate Curie temperature $T_C$, which typically lies at 200° C. to 250° C., depending on the fine composition, a transverse field with a strength of approximately 2,000 A/cm is switched on and the magnetic core is then cooled back to room temperature under the effect of this field at a cooling rate of between 0.2 K/min and approximately 2 K/min. This example of a heat treatment is shown in FIG. 14 and has been shown to be particularly effective for alloys with a composition of $CO_{68}Fe_{3.5}Mo_{1.5}Si_{16.5}B_{10.5}$ and $CO_{68.4}Fe_{3.4}Mn_{1.0}Mo_{0.5}Si_{16.5}B_{10.2}$. Magnetic cores made from the alloy first mentioned have a permeability of approximately 160,000 in this case, and magnetic cores made of the second alloy mentioned have a permeability of approximately 52,000 in this case.

Figure 15:
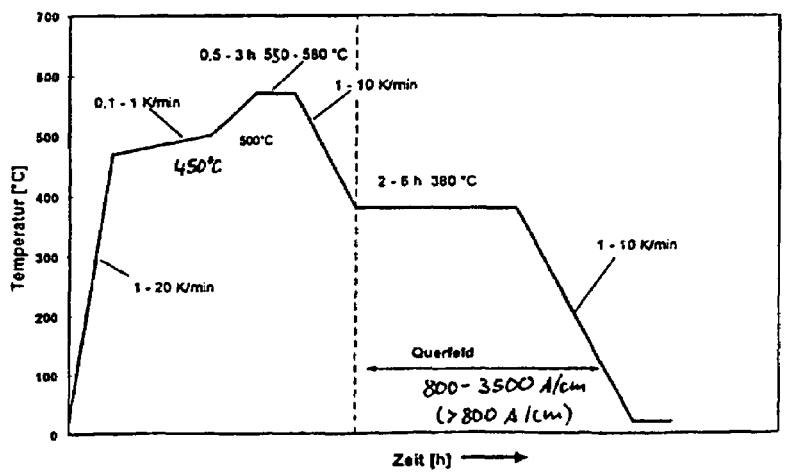

It has also been shown to be advantageous for extremely high permeability nanocrystalline alloys, i.e., for nanocrystalline alloys which have permeabilities of significantly more than 20,000, to perform the following special heat treatment. Magnetic cores made of such nanocrystalline alloys are first, for example, heated to a target temperature of approximately 450° C. at a heating rate between approximately 1 and approximately 20 K/min, subsequently further heated to a temperature of approximately 500° C. at a heating rate between approximately 0.1 and approximately 1 K/min, and then finally heated further to a target temperature between approximately 550° C. and approximately 580° C. The magnetic cores are then left at this target temperature for a period between approximately 0.5 hours and approximately 3 hours. The magnetic cores are subsequently cooled to a temperature of approximately 360° C. at a cooling rate between approximately 1 and approximately 10 K/min. Upon reaching this second target temperature, a transverse field with a strength of approximately 2,000 A/cm is switched on and the cores are left at this second temperature for a period between approximately 2 hours and approximately 6 hours. Subsequently, they are cooled back to room temperature at a cooling rate between approximately 1 and approximately 10 K/min while maintaining the transverse field. Naturally, due to the extraordinarily high permeability of such magnetic cores, they are again magnetically gapped via slots. This example of a heat treatment is shown in FIG. 15.

Various methods have been successfully investigated for introducing a slot in the magnetic core to set the height and frequency response of the effective permeability $\mu_{eff}$. Spark erosion, careful sawing, e.g., with diamond saws, water jet cutting, or cutting by means of a fine cutting wheel have been shown to be particularly suitable for introducing the slot. It has been observed in this case that the quality of the slot is very decisive in the frequency response of the permeability and therefore of the insertion loss. Particularly high cutting quality was achieved by means of impregnation of the cut zone with a low-viscosity artificial resin, which penetrates between the tape layers of the core due to the capillary effect. In these cases, locally occurring excessive losses in the cut zone were comparatively small and, as a consequence, the frequency response of the permeability was significantly more constant than for raw cut surfaces.

Following the heat treatment and the introduction of the slot, the magnetic cores are surface passivated, coated, whirl sintered, or encapsulated in a trough, provided with the primary and/or secondary windings, and possibly glued or embedded in the component housing. In this case, there is also the possibility of using a design in so-called planar technology. This method is independent of whether the magnetic core is made of amorphous or nanocrystalline material. However, the mechanical handling of the annealed nanocrystalline magnetic core must be performed with particular care because of its brittleness.

A further manufacturing possibility is that the tape is first subjected to a transverse field tempering as it passes and is subsequently wound into the tape core. The further sequence runs as described above.

The magnetic cores produced with these methods then fulfill the following requirements:

the main inductance of the wound ring tape core is, depending on the design of the filter choke, in the range from 0.1 to 2 mH, the main inductance is also less than 100 µH for particular embodiments of the filter (e.g., elliptical characteristic).

The main inductance meets this value even under maximum alternating modulation for the frequencies established according to the standards.

The linearity error of the hysteresis loop of the core is so low that the following applies:

$0.8 \leq \mu(B)/\mu(B=0) \leq 1.2$, preferably $0.9 \leq \mu(B)/\mu(B=0) \leq 1.1$ for $B=0-0.8*B_s$.

The bit error rates achievable in typical user circuits conform to the norms (ANSI T1E1.413 and ETSI ETR 328).

Using amorphous and nanocrystalline magnetic materials, after balanced transverse field annealing, the typical minimum core dimensions shown in table 1, for example, result for predetermined values of the main inductance, with the dimensions being given in the sequence outer diameter, inner diameter, and height.

TABLE 1

| $L_{haupt}$ [µH] | core dimension [mm³] | core mass [g] | material |
|---|---|---|---|
| 560 | 9.8*6.5*4.4 | 1.2 | $Co_{72.8}Fe_{4.7}Si_{5.5}B_{17}$ |
| 820 | 9.3*5.5*2.5 | 0.78 | $Co_{72.8}Fe_{4.7}Si_{5.5}B_{17}$ |
| 410 | 9.8*6.5*4.4 | 1.2 | $Co_{55.6}Fe_{6.1}Mn_{1.1}Si_{4.3}B_{16.2}Ni_{16.5}$ |
| 700 | 6.0*4.0*2.0 | 0.18 | $Fe_{88.2}Co_{1.8}Zr_7B_2Cu_1$ |
| 950 | 8.0*4.0*4.0 | 0.87 | $Fe_{73.5}Cu_1Nb_3Si_{15.5}B_7$ |

Similar core dimensions also result upon the use of the other alloys listed below, which can be used depending on the application.

An array of relationships must be considered in the dimensioning of the inductive components.

The relationship $$L = N^2 \mu_o \mu_r A_{fe}/l_{fe} \quad (2)$$

applies for the inductive components, with

L=inductance of the component

N=number of turns per unit length $\mu_o$=universal permeability constant $\mu_r$=permeability of the material $A_{Fe}$=iron cross-section of the magnetic core $l_{Fe}$=iron path length of the magnetic core.

From equation (2), it is obvious that the necessary inductance can only be achieved with minimum structural volume if the number of turns per unit length, permeability, core cross-section, and iron path length are adjusted to one another. The permeability μ, applicable over the entire range of the operating frequency, or, for slotted embodiments, the effective permeability $\mu_{eff}$ of the core material is, besides the favorable ring-shaped geometry, the decisive parameter for the most compact possible dimension of the transformer. Depending on which of the following alloys listed is used and how the associated heat treatment is performed, a permeability range between 500 and more than 100,000 can be covered in a defined way. By introducing a slot into the magnetic core, the lower limit of the permeability can be displaced down to 100 or even less (see FIG. 4). For the inductive components of the high-pass branch 7, the permeability range μ or $\mu_{eff}$<30,000, particularly <2,500, is used, which provides a high degree of flexibility in regard to the dimensioning of the inductive components. The inductive components for the high-pass branch 7 implemented with these magnetic cores have a strong advantage in volume relative to the slotted ferrite cores due to their construction and the high saturation induction of the magnetic cores.

A fundamental restriction arises in the selection of the core material for the inductive components of the high-pass branch 7 in that the magnetic core may not be magnetized near saturation by the high voltage amplitudes $U_{ac}$ (ADSL). The induction corresponding to the signal modulation is given by $$B_{ac} = (1/N\, A_{fe}) * \int U_{ac} dt \quad (3)$$

The permeability and the distortion factor can only fall very slightly with this signal modulation. For these reasons, the judgment of the material is performed with reference to $\mu(B_{ac})$ and distortion factor characteristic curves.

Since the distortion factor rises with increasing amplitude of magnetic induction B, the alloy composition must be determined in combination with the transverse field heat treatment so that, on one hand, the saturation induction is as high as possible, and, on the other hand, the permeability is below an upper limit dependent on the operating conditions.

A lower permeability μ or $\mu_{eff}$ has an increase of the number of turns per unit length N and therefore, with a predetermined voltage amplitude according to equation (3), a lower amplitude of magnetic induction B as a consequence, which leads to a better distortion factor.

In the following, suitable alloy systems will now be described more detail. It was found that with the alloy systems described in the following, if the conditions described above were maintained, inductive elements for high-pass branches with particularly linear hysteresis loops and small structural shapes could be produced which had all the properties conforming to the standards.

In the alloy systems listed below, the greater than/less than signs enclose the limits, all at % information should be considered approximate.

Alloy System 1:

A first alloy system suitable for high-pass branch 7 has the composition $Co_a(Fe_{1-c}Mn_c)_b Ni_d M_e Si_x B_y C_z$, with M indicating one or more elements from the group Nb, Mo, Ta, Cr, W, Ge, and P and a+b+d+e+x+y+z=100, with Co: a=40–82 at %, preferably a>50 at %,
Fe+Mn: b=3–10 at %,
Mn/Fe: c=0–1, preferably c<0.5,
Ni: d=0–30 at %, preferably d<20 at %,
M: e=0–5 at %, preferably e<3 at %,
Si: x=0–17 at %, preferably x>1 at %,
B: y=8–26 at %, preferably 8–20 at %,
C: z=0–3 at %,
15<e+x+y+z<30, preferably 18<e+x+y+z<25.

Alloys of this system remain amorphous after the heat treatment. Depending on the composition and heat treatment, extremely linear hysteresis loops having a very wide permeability range between 500 and 100,000 or more can be implemented with this system. To achieve the inductances conforming to the standards, the magnetic cores were magnetically gapped in some cases by introducing a slot of a suitable width.

In this case, it has been shown to be particularly important that the value of the saturation magnetostriction can be reliably set to particularly small values of $|\lambda_s|<0.1$ ppm with a heat treatment tailored to the alloy composition. A particularly linear loop shape results in this way, which leads to a particularly high consistency of the permeability over a wide induction range. In addition, the occurrence of damaging magnetoelastic resonances of the ring-shaped core are avoided by this. At specific frequencies of the induction curve, these may lead to breaks of the permeability or to elevated hysteresis losses. During the experiments it was discovered that precisely the combination of this near freedom from magnetostriction, a tape thickness which was as low as possible (preferably less than 17 μm), and a comparatively high specific electrical resistance of 1.1 to 1.5 μΩm leads to extremely good frequency response, which is particularly suitable for the ADSL high-pass filter 10 and the ADSL high-pass transformer 9.

Alloy System 2:

A second alloy system has the composition $Fe_a Co_b Cu_c Si_d B_e M_f$ with M indicating an element from the group Nb, W, Ta, V, Zr, Hf, Ti, Mo, or a combination of these and a+b+c+d+e+f=100%, with Fe: a=100%–b–c–d–e–f,
Co: b=0–15% at %, preferably 0—0.5% at %,
Cu: c=0.5–2 at %, preferably 0.8–1.2 at %,
M: f=1–5 at %, preferably 2–3 at %,
Si: d=6.5–18 at %, preferably 14–17 at %,
B: e=5–14 at %.

with d+e>18 at %, preferably d+e=22–24 at %. Alloys of this system had been shown to be very suitable for the ADSL high-pass branch 7 due to their linear loop shape and their very good frequency response. Particularly good ADSL high-pass properties are achieved in the alloy compositions designated with "preferably," since in this case, just as in the alloy system 1, a zero crossing of the saturation magnetostriction may be achieved. At the same time, it was also found out that precisely the combination of a high specific electrical resistance of 1.1 to 1.2 μΩm and a low tape thickness led to outstanding frequency response and therefore outstanding properties of the ADSL high-pass transformer 9 and the high-pass filter choke 14.

The comparatively high saturation induction for extremely linear loops, measured at $B_s=1.1—1.3$ T, has also been shown to be very advantageous, since in this way high induction values of 1 T or even more may be modulated. In addition, it was found that the temperature characteristic of the magnetic core may be adjusted in a targeted way by means of the heat treatment for setting the permeability. From this, precisely in rough environmental conditions, which can certainly occur in telecommunication devices, advantages specific to an application which cannot be implemented in other ways may arise. For ring tape cores having higher permeability values, gapping by means of a slot was used to set the properties conforming to the standards.

Alloy System 3:

A third alloy system suitable for high-pass filters has the composition $Fe_xZr_yNb_zB_vCu_w$, with x+y+z+v+w=100 at %, with Fe: x=100 at %−y−z−v−w, preferably 83–86 at %,
Zr: y=2–5 at %, preferably 3–4 at %,
Nb: z=2–5 at %, preferably 3–4 at %,
B: v=5–9 at %,
Cu: w=0.5–1.5 at %, preferably 1 at %, with y+z>5 at %, preferably 6–7 at %, and y+z+v>11 at %, preferably 12–16 at %.

With alloys of this system, transverse field heat treatments could be performed alloy-specific in the interval between 550° C. and 650° C., and linear loop shapes and a good frequency response, suitable for the ADSL high-pass filter 10, could be achieved. The high saturation induction of approximately 1.5 to 1.6 T had a particularly favorable effect on the size of the component.

Alloy System 4:

A further suitable alloy system has the composition $Fe_xM_yB_zCu_w$, with M indicating an element from the group Zr, Hf, Nb and x+y+z+w=100 at %, with Fe: x=100 at %−y−z−w, preferably, 83–91 at %,
M: y=6–8 at %, preferably 7 at %,
B: z=3–9 at %,
Cu: w=0–1.5 at %.

The basic requirement of $|\lambda_s|<1$ ppm could be fulfilled with alloys of this system. The alloy-specific permeabilities achieved with the transverse field treatments performed between 550° C. and 650° C. were relatively low, between 2,000 and 15,000. The linearity requirements necessary for the ADSL high-pass filter 10 were met above all in this case in the upper range of the transverse field temperatures. Very small designs could be implemented due to the high saturation induction of 1.4 to 1.5 T.

Alloy System 5:

Finally, a fifth alloy system has the composition $(Fe_{0.98}CO_{0.02})_{90-x}Zr_7B_{2+x}Cu_1$, with x=0–3, preferably x=0, with the residual alloy component Co able to be replaced by Ni with appropriate equalization.

In this system, a zero crossing in the saturation magnetostriction was achieved with alloy-specific tailored transverse field heat treatment, which led to particularly linear hysteresis curves. In this way, the frequency responses of the complex permeability were so greatly improved that they came very close to those of alloy systems 1 and 2. The high saturation induction, which was measured at values of $B_s=1.65$ to 1.75 T, was shown to be an outstanding advantage of this system. Through the particularly favorable combination of near freedom from magnetostriction and high saturation induction, low-distortion usable induction amplitudes of up to 1.5 Tesla and more could be implemented, through which particularly small structural shapes, which were to be used both for the ADSL high-pass filter choke 14 and for the ADSL high-pass transformer 9, were made possible.

The alloy systems 2 to 5 obtain a fine crystalline structure with grain diameters under 100 nm after the heat treatment. These grains are surrounded by an amorphous phase which, however, occupies less than 50% of the material volume.

All of the alloy systems 1 to 5 are distinguished by the following properties:

extremely linear hysteresis loops;
amount of the saturation magnetostriction $|\lambda_s|<2$ ppm, preferably <0.1 ppm after the heat treatment. In the cobalt-based amorphous materials, the saturation magnetostriction may be set by fine-tuning the Fe and Mn content appropriately. In the nanocrystalline alloys, the saturation magnetostriction can be set via the size of the fine crystalline grain, which can be produced by a targeted adjustment of the heat treatment, the metalloid content, and the content of refractory metals.
saturation induction of 0.6 T to 1.7 T, with the saturation induction able to be fine-tuned by selection of the content of Ni, Co, M, Si, B, and C.
tapes whose thickness can be less than 17 μm;
high specific electrical resistance, which can be up to 1.5 μΩm.

The requirements and alloy ranges described above were maintained and/or fulfilled after performing the heat treatment described, e.g., through the exemplary alloys listed in table 2.

TABLE 2

| Alloy composition [at %] | structure | saturation induction [T] | anisotropic field strength $H_3$ [A/cm] | saturation magnetostriction $\lambda_s$ as quenched | heat-treated |
|---|---|---|---|---|---|
| $Co_{71.7}Fe_{1.1}Mo_1Mn_4Si_{13.2}B_9$ | amorphous | 0.82 | 1.5 | $-12*10^{-8}$ | $-3.5*10^{-8}$ |
| $Co_{72.5}Fe_{1.5}Mo_{0.2}Mn_4Si_{4.8}B_{17}$ | amorphous | 1.0 | 3.5 | $-12*10^{-8}$ | $-4.1*10^{-8}$ |
| $Co_{72.8}Fe_{4.7}Si_{5.5}B_{17}$ | amorphous | 0.99 | 4.8 | $-32*10^{-8}$ | $-1.6*10^{-8}$ |
| $Co_{55.6}Fe_{6.1}Mn_{1.1}Si_{4.3}B_{16.2}Ni_{16.5}$ | amorphous | 0.93 | 8.0 | $-110*10^{-8}$ | $+4.2*10^{-8}$ |
| $Fe_{73.5}Cu_1Nb_3Si_{15.5}B_7$ | nanocr. | 1.21 | 0.7 | $-24*10^{-6}$ | $+1.6*10^{-7}$ |
| $(Fe_{0.98}Co_{0.02})_{90}Zr_7B_2Cu_1$ | nanocr. | 1.70 | 1.7 | — | $-1.0*10^{-7}$ |
| $Fe_{84}Zr_{3.5}Nb_{3.5}B_8Cu_1$ | nanocr. | 1.53 | 0.8 | $+3*10^{-6}$ | $+1.5*10^{-7}$ |
| $Fe_{84}Nb_7B_9$ | nanocr. | 1.5 | 1.1 | — | $+1.0*10^{-7}$ |

The amorphous, fine crystalline, or nanocrystalline alloys listed in table 2 are distinguished by particularly high values of the saturation induction of up to 1.7 Tesla. This allows comparatively high permeability values, which produces further advantages in regard to overall size and taping relative to ferrite transformers.

LIST OF REFERENCE NUMBERS

1 local exchange
2 network connection
3 public two-wire line
4 separating filter
5 ADSL branch 6 ISDN/POTS branch
7 high-pass branch
8 low-pass branch
9 high-pass transformer
10 high-pass filter components
11 coils
12 capacitor
13 capacitor
14 high-pass filter choke

What is claimed is:

1. A frequency separating filter having a low-pass branch for low frequency signals, particularly of analog communication systems, and a high-pass branch for high frequency signals of digital communication systems, with multiple inductive components with magnetic cores, wherein the high-pass branch comprises a pass range above about 20 kHz, at least one component with a magnetic core made of an amorphous or nanocrystalline alloy, and wherein the alloy has the composition $Co_a(Fe_{1-c}Mn_c)_bNi_dM_eSi_xB_yC_z$, with M indicating one or more elements from the group Nb, Mo, Ta, Cr, W, Ge, and P and $a+b+d+e+x+y+z=100$, with
   Co: a=40–82 at %,
   Fe+Mn: b=3–10 at %,
   Mn/Fe: c=0–1,
   Ni: d=0–30 at %,
   M; e=0–5 at %,
   Si: x=0–17 at %,
   B: y=8–26 at %,
   C: z=0–3 at %,
   $15<e+x+y+z<30$.

2. The frequency separating filter according to claim 1, wherein the following relationships apply:
   Co: a=50–82 at %,
   Fe+Mn: b=3–10 at %,
   Mn/Fe: c=0–0.5,
   Ni: d=0–20 at %,
   M: e=0–3 at %,
   Si: x=1–17 at %,
   B: y=8–20 at %,
   C: z=0–3 at %,
with $18<e+x+y+z<25$.

3. A frequency separating filter having a low-pass branch for low frequency signals, particularly of analog communication systems, and a high-pass branch for high frequency signals of digital communication systems, with multiple inductive components with magnetic cores, wherein the high-pass branch comprises a pass range above about 20 kHz, at least one component with a magnetic core made of an amorphous or nanocrystalline alloy, and wherein the alloy has the composition $Fe_aCu_cM_fSi_dB_e$, with M indicating an element from the group Nb, W, Ta, Zr, Hf, Ti, Mo, or a combination of these and $a+c+f+d+e=100\%$, with
   Fe: a=100%–c–f–d–e,
   Cu: c=0.5–2 at %,
   M: f=1–5 at %,
   Si: d=6.5–18 at %,
   B: e=5–14 at %,
with d+e>18 at %.

4. The frequency separating filter according to claim 3, wherein the following relationships apply:
   Cu: c=0.8–1.2 at %,
   M: f=2–3 at %,
   Si; d=14–17 at %,
   B: e=5–14 at %,
with d+e=22–24 at %.

5. The frequency separating filter according to claim 4, wherein the alloy also has Cob with
   Co: b=0—0.5 at %.

6. The frequency separating filter according to claim 3, wherein the alloy also has an element which is Co or Ni.

7. The frequency separating filter according to claim 6, wherein the alloy also has $Co_b$ with
   Co: b=0–15 at %.

8. A frequency separating filter having a low-pass branch for low frequency signals, particularly of analog communication systems, and a high-pass branch for high frequency signals of digital communication systems, with multiple inductive components with magnetic cores, wherein the high-pass branch comprises a pass range above about 20 kHz at least one component with a magnetic core made of an amorphous or nanocrystalline alloy, and wherein the alloy has the composition $Fe_xZr_yNb_zB_vCu_w$, with $x+y+z+v+w=100$ at %, with
   Fe: x=100 at %–y–z–v–w,
   Zr: y=2–5 at %,
   Nb: z=2–5 at %,
   B: v=5–9 at %,
   Cu: w=0.5–1.5 at %,
with y+z>5 at % and y+z+v>11 at %.

9. The frequency separating filter according to claim 8, wherein the following relationships apply;
   Fe: x=83–86 at %,
   Zr: y=3–4 at %,
   Nb: z=3–4 at %,
   B: v=5–9 at %,
   Cu: w=1 at %,
with y+z=6–7 at %,
and y+z+v>12–16 at %.

10. A frequency separating filter having a low-pass branch for low frequency signals, particularly of analog communication systems, and a high-pass branch for high frequency signals of digital communication systems, with multiple inductive components with magnetic cores, wherein the high-pass branch comprises a pass range above about 20 kHz, at least one component with a magnetic core made of an amorphous or nanocrystalline alloy, and wherein the alloy has the composition $Fe_xM_yB_2Cu_w$, with M indicating an element from the group Zr, Hf, Nb and $x+y+z+w=100$ at %, with
   Fe: x=100 at %–y–z–w,
   M: y=5–8 at %,
   B: z=3–9 at %,
   Cu: w=0–1.5 at %.

11. The frequency separating filter according to claim 10, wherein the following relationships apply:
   Fe: x=83–91 at %,
   M: y=7 at %,
   B: z=3–9 at %,
   Cu: w=0–1.5 at %.

12. A frequency separating filter having a low-pass branch for low frequency signals, particularly of analog communication systems, and a high-pass branch for high frequency signals of digital communication systems, with multiple inductive components with magnetic cores, wherein the high-pass branch comprises a pass range above about 20 kHz, at least one component with a magnetic core made of an amorphous or nanocrystalline alloy, and wherein the alloy has the composition $(Fe_{0.98}Co_{0.02})_{90-x}Zr_7B_{2+x}Cu_1$, with x=0–3, with the residual alloy component Co able to be replaced by Ni with appropriate equalization.

13. The frequency separating filter according to claim 12, wherein x=0.

* * * * *